United States Patent [19]
Sethi

[11] Patent Number: 5,284,786
[45] Date of Patent: Feb. 8, 1994

[54] METHOD OF MAKING A SPLIT FLOATING GATE EEPROM CELL

[75] Inventor: Rakesh B. Sethi, Campbell, Calif.

[73] Assignee: National Semiconductor Corporation, Santa Clara, Calif.

[21] Appl. No.: 930,311

[22] Filed: Aug. 14, 1992

[51] Int. Cl.⁵ ........................................... H01L 21/336
[52] U.S. Cl. ..................................... 437/43; 437/978; 437/979; 257/321
[58] Field of Search ..................... 437/43, 979, 978

[56] References Cited

U.S. PATENT DOCUMENTS 4,992,391  2/1991  Wang .
5,049,516  9/1991  Arima .

FOREIGN PATENT DOCUMENTS 941072  1/1974  Canada .
57-76877  5/1982  Japan .
2-96377  4/1990  Japan .

Primary Examiner—George Fourson
Attorney, Agent, or Firm—Limbach & Limbach

[57] ABSTRACT

A split floating gate EEPROM memory cell formed in a P-type silicon substrate includes source and drain buried n+ diffusion regions formed in the silicon substrate to define a substrate channel region therebetween. A layer of floating gate oxide about 400Å thick is formed over the source and drain regions and over the channel region. The floating gate oxide includes a region of thin tunnel oxide about 80–100Å thick formed therein over the drain region. A floating gate is formed on the floating gate oxide to extend over the channel region and includes a portion that extends over the tunnel oxide. The floating gate comprises a first layer of polysilicon about 300–600Å thick, a silicon dioxide layer about 20–50Å thick formed on the first layer of polysilicon, and a second layer of polysilicon about 2000Å thick formed on the silicon dioxide layer. A layer of ONO is formed on the floating gate and a polysilicon control gate is formed on the layer of ONO.

6 Claims, 4 Drawing Sheets

METHOD OF MAKING A SPLIT FLOATING GATE EEPROM CELL

BACKGROUND OF THE INVENTION

1. Field of the Invention

The present invention relates to integrated circuit memory devices and, in particular, to an electrically-erasable programmable read only memory (EEPROM) storage cell that utilizes a split floating gate to provide a linear relationship between the number of read pulses applied to the floating gate and the cell's threshold voltage $V_T$ shift.

2. Discussion of the Prior Art

The fundamental challenge in creating an EEPROM cell is to use a controllable and reproducible electrical effect which has enough nonlinearity so that the cell can be written or erased at one voltage in less than 1 ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon, the energy difference between the conduction band and the valence band is 1.1 eV. In silicon dioxide, the energy difference between these bands is about 8.1 eV, with the conduction band in silicon dioxide 3.2 eV above that in silicon. Since electron energy is about 0.025 eV at thermal room temperature, the probability that an electron in silicon can gain enough thermal energy to surmount the Si-to-SiO₂ barrier and enter the conduction band in silicon dioxide is very small. If electrons are placed on a polysilicon floating gate surrounded by silicon dioxide, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si—SiO₂ interface, the energy bands will be distorted and there is a small probability that an electron in the conduction band of the silicon will quantum mechanically tunnel through the energy barrier and emerge in the conduction band of the silicon dioxide.

The tunneling current increases exponentially with the applied field in accordance with the following general current density expression:

$$J = (AE^2) \exp(-B/E)$$

where
A and B are constants, and
E is the field at the Si—SiO₂ interface

This current is observable at a current density of 10E-6 A/cm2 when the field at the Si—SiO₂ interface is about 10 MV/cm. Local fields of this magnitude, at voltages that are practical for use in microelectronics, can be obtained by applying a voltage across either a thin (about 100Å) oxide grown on bulk silicon or across thicker (about 500Å) oxide grown on polysilicon.

The theoretically ideal EEPROM memory cell comprises a single transistor addressable by applying electrical signals to a specified row and a specified column of the memory array matrix. For example, to write a logic "1" or a logic "0" into this "ideal" cell, a voltage is applied to the control gate corresponding to the row (word line) of the selected cell while a voltage corresponding to either a "1" or a "0" is applied to the source or drain corresponding to the column (bit line) of the selected cell.

The basic concept of the well-known FLOTOX EEPROM memory cell is shown in FIG. 1. In the FLOTOX cell, the tunnel oxide, which typically is less than 100Å thick, is grown over an area defined photolithographically in the drain region (or an extension of the drain region, called buried n+). Charging of the floating gate to program the cell is achieved by grounding the source and the drain and applying a high voltage to the control gate.

The FLOTOX cell is designed such that a large fraction of the applied voltage is coupled across the tunnel oxide resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from a $\leq 5V$ supply.

If a single transistor memory cell is placed in a typical array with drains connected to metal columns and gates connected to common polysilicon word lines, the erasing of the cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

FIG. 2 provides a layout of the FIG. 1 FLOTOX cell, with the FIG. 1 cross-section being taken perpendicular to the word line (control gate) and through the tunnel oxide window.

In the conventional FLOTOX EEPROM cell, the buildup of floating gate potential due to electrons arriving from the conduction band of the tunnel oxide affects Fowler-Nordheim tunneling. This relationship is not linear. Therefore, it is difficult to use the standard FLOTOX EEPROM cell in applications that require linearity, such as for example, as an analog weight in a neural network device.

As is well-known, and as shown in FIG. 3, each of the information processing nodes of a neural network has n simultaneous inputs $X_i = 1, 2, \ldots, n$, and a threshold quantity $\theta_j$, which are combined according to Eq (1) to produce single quantity $r_j$;

$$r_j = \sum_{i=1}^{n} X_i - \theta_j \qquad (1)$$

This is followed by a nonlinear transformation, Eq. (2), which produces the output $y_j$;

$$Y_j = \phi(r_j) \qquad (2)$$

The weighted output of one node can then become one of the inputs to a different node. Thus, the connection of external inputs and nodes by means of information weight parameters $W_{ij}$ forms a neural network. A connection between node i and node j is a distinct machine component which constrains information flow via the connecting weighting parameter $W_{ij}$, as shown in FIG. 4, the numerical value of which is problem-dependent.

The values of the weighting factors $W_{ij}$ are, thus, the memory of the neural network and must "learn" according to an algorithm specified for establishing the weighting factor. That is, the weight factors must be "trainable".

In utilizing a conventional FLOTOX EEPROM cell for storing the weighting factor, adjustment of the weighting factor involves reading the cell and then adjusting its programming voltage Vpp in response to the associated weighting algorithm. Therefore, the array architecture must provide for a variation in the programming voltage Vpp. However, if the programming voltage Vpp becomes to high, then cell breakdown becomes a problem.

It would, therefore, be desirable to have available an EEPROM cell that relies on a fixed programming voltage Vpp but that can accommodate variations in floating gate voltage $V_{FG}$.

SUMMARY OF THE INVENTION

The present invention provides a split floating gate memory cell formed in a P-type silicon substrate. The split floating gate memory cell includes source and drain buried n+ diffusion regions formed in the silicon substrate to define a substrate channel region therebetween. A layer of floating gate oxide about 400Å thick is formed over the source and drain regions and the channel region. The floating gate oxide includes a region of thin tunnel oxide about 80–100Å thick formed over the drain region to promote Fowler-Nordheim tunneling. A floating gate is formed on the floating gate oxide to extend over the channel region and includes a portion that extends over the thin tunnel oxide over the drain region. In accordance with the invention, the floating gate is split into three layers: a first layer of polysilicon about 300–600Å thick (injector poly), a layer of silicon dioxide about 20–50Å thick formed on the first layer of polysilicon, and a second layer of polysilicon about 2000Å thick formed on the silicon dioxide layer. A layer of oxide/nitride/oxide (ONO) is formed on the floating gate. Finally, a polysilicon control gate is formed on the layer of ONO.

The above-described structure results in a modification of the bandgap of injector polysilicon to achieve a linear relationship between the number of applied pulses and the threshold voltage shift of the cell. Furthermore, tunnel current flux during cell write/erase is independent of the floating gate potential. The cell programming/erase cycling and retention are unaffected by the split floating gate modification of the conventional FLOTOX cell.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

Figure 1:
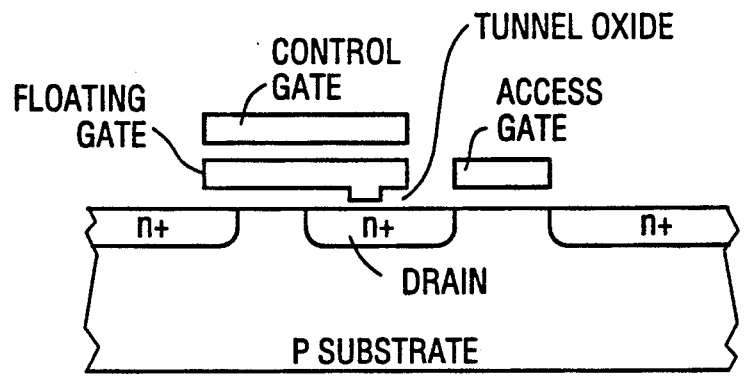
FIG. 1 is a cross-sectional drawing illustrating a conventional FLOTOX EEPROM cell.
Figure 2:
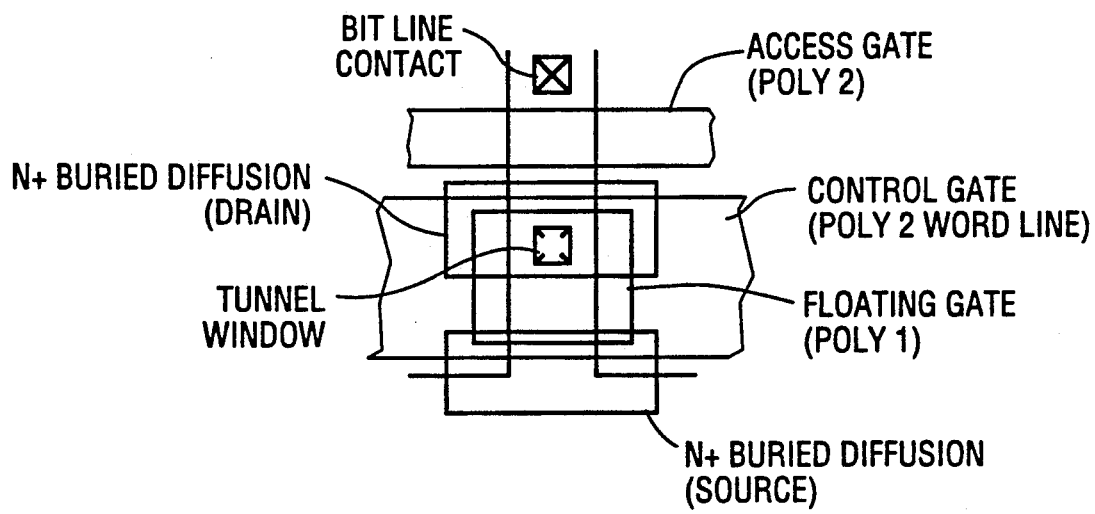
FIG. 2 is a layout corresponding to the FIG. 1 FLOTOX EEPROM cell.
Figure 3:
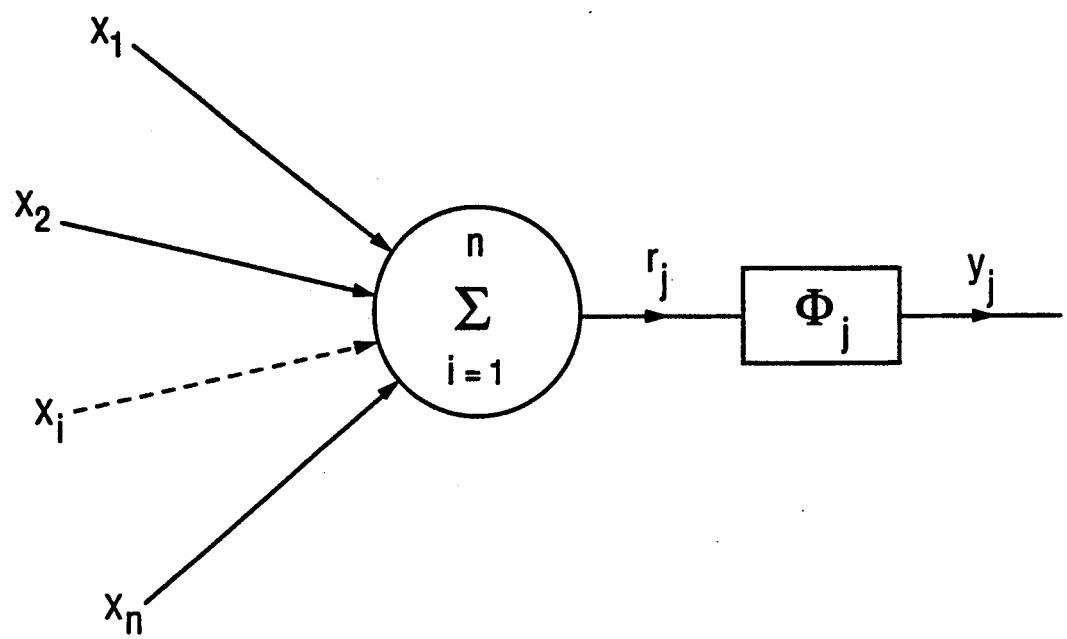
FIG. 3 is a block diagram illustrating a node in a neural network.
Figure 4:
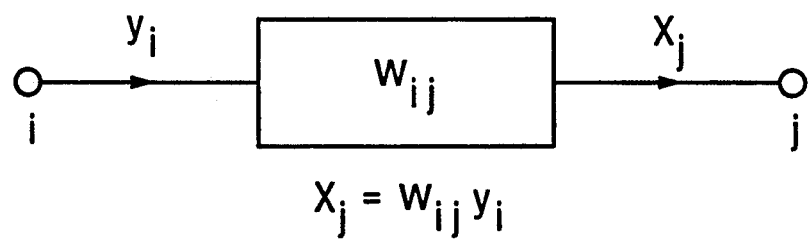
FIG. 4 is a block diagram illustrating a weighting factor between nodes in a neural network.
Figure 5:
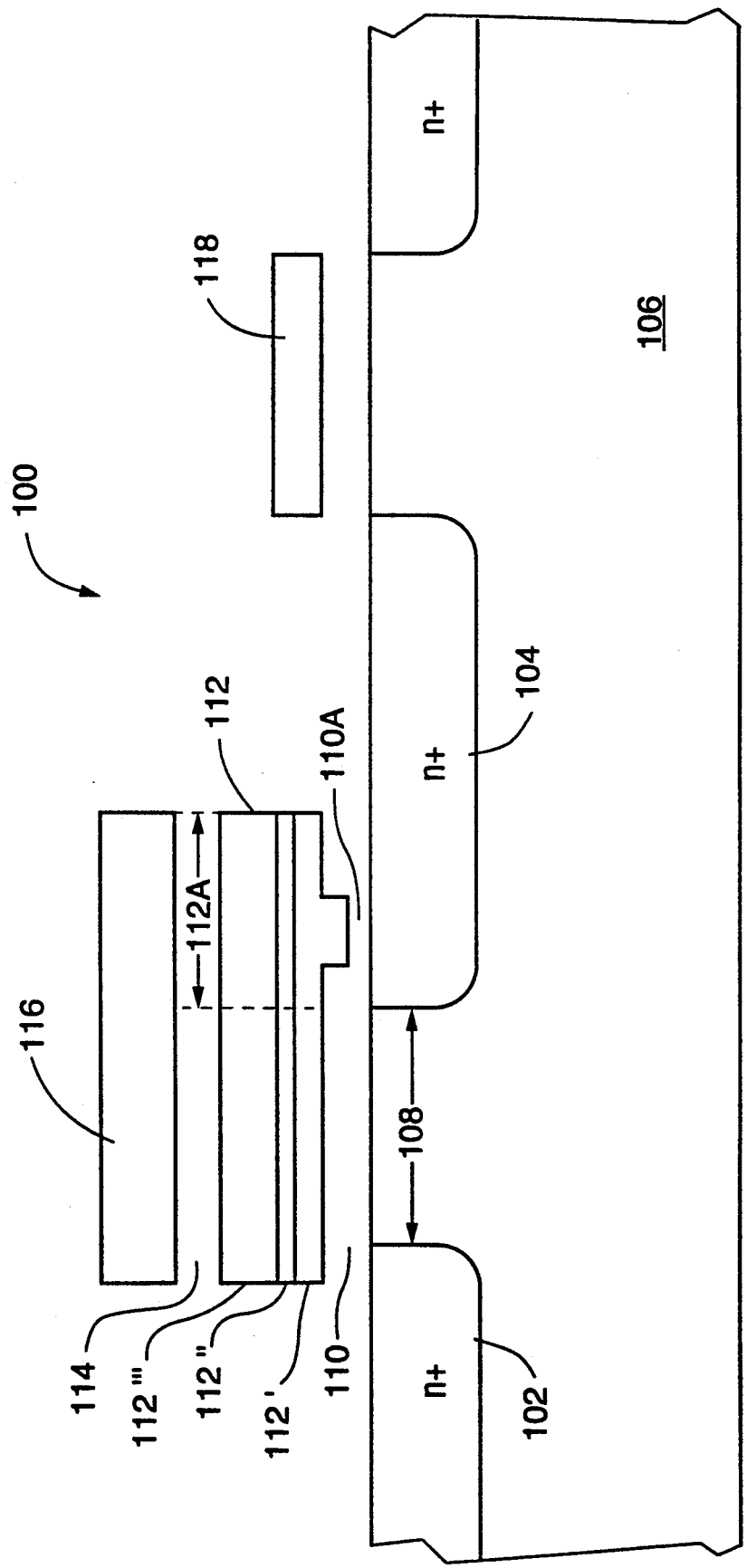
FIG. 5 is a cross-sectional drawing illustrating a split floating gate EEPROM cell in accordance with the present invention.

Referring to FIG. 5, in accordance with the present invention, the standard FLOTOX EEPROM cell is modified by reconfiguring the conventional polysilicon floating gate as follows. After tunnel oxide is grown or deposited, a thin layer of doped amorphous or polycrystalline polysilicon about 300–600Å thick is deposited. This is followed by growth or deposition of a layer of silicon dioxide about 20–50Å thick on the underlying polysilicon layer. At this point, either the tunnel window mask can be used to define a second layer of polysilicon or a second layer of additional polysilicon is deposited on the underlying silicon dioxide. This step is followed by the standard step of forming interpoly ONO about 200–250Å thick on the floating gate and defining an ONO/floating gate stack.

After the interpoly ONO stack is defined, the array is protected and those areas where the gates of the cell select transistors will be formed are opened and etched to the silicon substrate. A sidewall/oxidation spacer is then formed to adequately seal the ONO sidewalls and to grow the high voltage 200Å gate oxide on p- regions in the periphery. Following this step, the cell and select gate areas are masked and the periphery is wet etched to bare silicon and a high quality 190Å gate oxide is either thermally grown or deposited in low voltage areas of the periphery. Following these steps, the final thickness of the select transistor gate oxide is about 300Å. Finally, a second layer of polysilicon (poly2) about 4000Å thick is deposited and patterned to define the control gates and access gates of the EEPROM cells in the array. Self-aligned source/drain regions are then formed to define the peripheral devices according to standard procedures.

Thus, as shown in FIG. 5, the resulting split floating gate memory cell 100 includes a source buried n+ diffusion region 102 and drain buried n+ diffusion region 104 formed in a P-type silicon substrate 106 such that the source and drain regions 102, 104 define a substrate channel region 108 therebetween. A layer 110 of floating gate oxide about 400Å thick is formed over the source region 102, drain region 104 and channel region 108. The floating gate oxide 110 includes a region 110a of thin tunnel oxide about 80–100Å thick formed over the drain region 104. A split floating gate sandwich 112, as described above, is formed over the floating gate oxide 110 to extend over the channel region 108 and includes a portion 112a that extends over the thin tunnel oxide region over the drain region 104. In accordance with the invention, the floating gate 112 includes a first 300–600Å polysilicon layer 112', an intermediate 20–50Å silicon dioxide layer 112", and a second 2000Å polysilicon layer 112"'. As stated above, a layer 114 of ONO is formed on the floating gate 112, a polysilicon (poly2) control gate 116 is formed on the layer 114 of ONO, and a poly2 access gate 118 defines the cell's access transistor.

Figure 6:
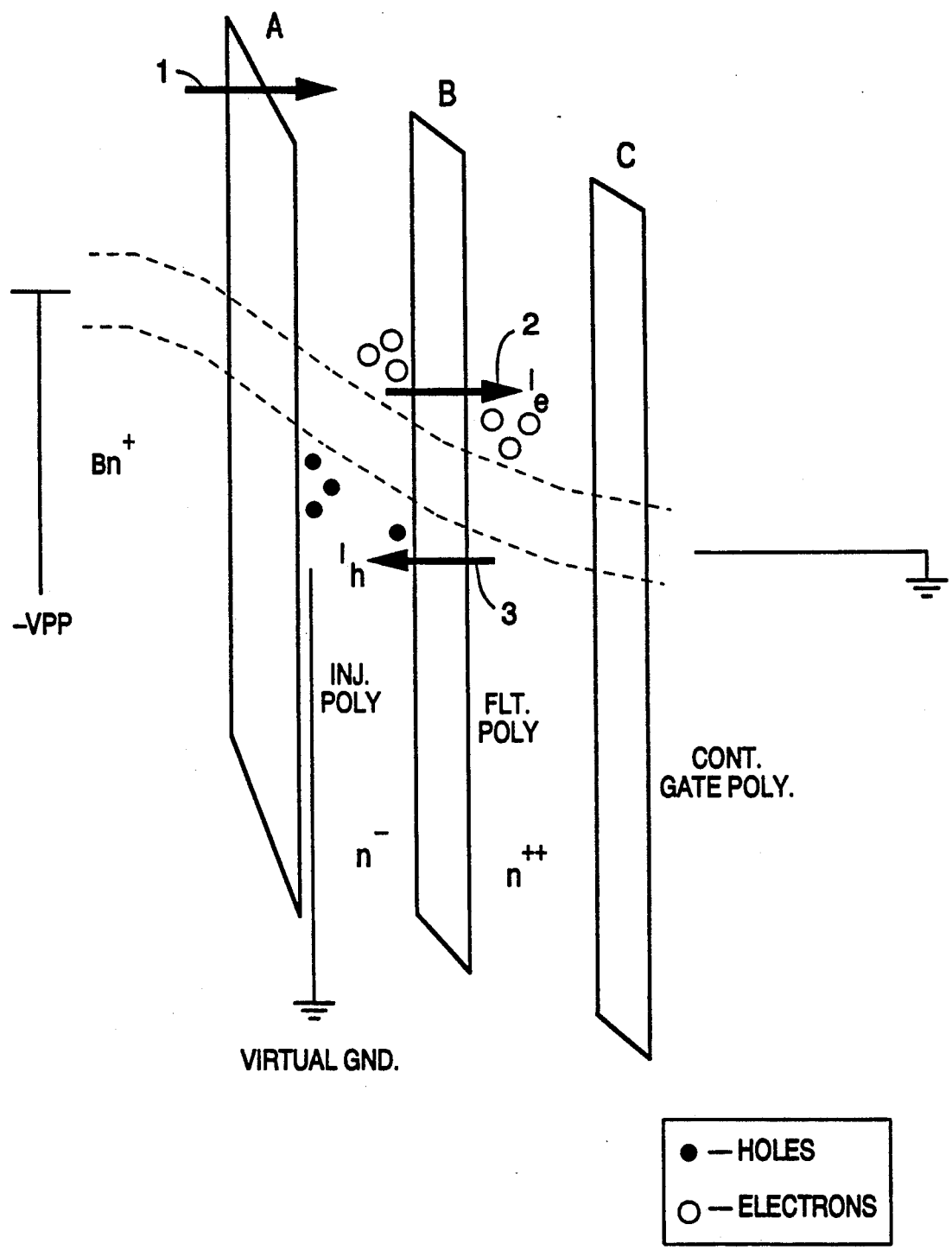
FIG. 6 is a schematic diagram illustrating the energy band of the FIG. 5 split floating gate EEPROM cell.

FIG. 6 illustrates the energy band diagram schematic of the completed split floating gate cell 100. The operation of the cell 100 during the write state can be understood as follows. At high electric fields, electrons are injected from the buried n+bit line into the conduction band of the tunnel oxide 110a, circled A in FIG. 6. This flux is shown as item 1 in FIG. 6. The hot electrons enter the conduction band of the thin polysilicon layer (injector poly) 112' and are thermalized there by scattering N dopant interactions. The distribution of electrons then becomes relatively cooler in energy and arrives at the oxide 112", circled B in FIG. 6. The electrons directly tunnel through this oxide 112" and enter the floating gate poly layer 112"' with no impedance from the oxide layer 112".

The current flux, marked as 2 in FIG. 6, does not depend on the floating gate potential. This can be understood as follows. Prior to beginning the process, the direct tunneling of holes, circled as item 3 in FIG. 6, from the floating gate to injector poly takes place. This leads to development of a hole layer buildup at the injector poly/tunnel oxide interface. The electron injection flux depends only on the electric field across the buried n+region and the injector poly. Simply put, the buildup of holes leads to a programming voltage Vpp across the tunnel oxide. This eliminates the need to physically have the injector poly grounded.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of forming a split floating gate memory cell in a semiconductor substrate having a first conductivity type, the method comprising:

(a) forming source and drain buried diffusion regions having a second conductivity type opposite the first conductivity type in the semiconductor substrate, the source and drain diffusion regions being spaced apart to define a substrate channel region therebetween;

(b) forming a layer of floating gate dielectric material over the source and drain regions and the channel region, the floating gate dielectric material including a region of tunnel dielectric formed therein over the drain region such that the thickness of the tunnel dielectric is less than the thickness of the floating gate dielectric material;

(c) forming a floating gate on the floating gate dielectric material to extend over the channel region and including a portion that extends over the tunnel dielectric, the floating gate comprising a layer of first conductive material, a layer of first dielectric material formed on the layer of first conductive material, and a layer of second conductive formed on the layer of first dielectric material;

(d) forming a layer of second dielectric material on the floating gate; and (e) forming a layer of third conductive material on the layer of second dielectric material.

2. A method as in claim 1 wherein the semiconductor substrate is P-type silicon and the source and drain regions are buried n+ diffusion regions.

3. A method as in claim 2 wherein the floating gate dielectric material is silicon dioxide about 400Å thick and the tunnel dielectric is silicon dioxide about 80–100Å thick.

4. A method as in claim 2 wherein the first conductive material is polysilicon about 300–600Å thick, the first dielectric material is silicon dioxide about 20–50Å thick, and the second conductive material is polysilicon about 2000Å thick.

5. A method as in claim 2 wherein the second dielectric material is a sandwich of oxide/nitride/oxide (ONO) about 200–250Å thick.

6. A method as in claim 2 wherein the third conductive material is polysilicon about 4000Å thick.

* * * * *

UNITED STATES PATENT AND TRADEMARK OFFICE
CERTIFICATE OF CORRECTION

PATENT NO. : 5,284,786
DATED      : FEBRUARY 8, 1994
INVENTOR(S): RAKESH B. SETHI

It is certified that error appears in the above-indentified patent and that said Letters Patent is hereby corrected as shown below:

In Col. 6, line 20, after "conductive" insert --material--.

Signed and Sealed this

Twenty-first Day of June, 1994

Attest:

BRUCE LEHMAN

*Attesting Officer*    *Commissioner of Patents and Trademarks*